(12) United States Patent
Tsai et al.

(10) Patent No.: US 11,353,791 B2
(45) Date of Patent: Jun. 7, 2022

(54) PHOTOSENSITIVE DRY FILM AND USES OF THE SAME

(71) Applicant: ETERNAL MATERIALS CO., LTD., Kaohsiung (TW)

(72) Inventors: Tsung-Hsiu Tsai, Kaohsiung (TW); Ming-Jhe Li, Kaohsiung (TW); Chang-Hong Ho, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 15/880,948

(22) Filed: Jan. 26, 2018

(65) Prior Publication Data

US 2018/0210342 A1 Jul. 26, 2018

(30) Foreign Application Priority Data

Jan. 26, 2017 (TW) .................................. 106103238

(51) Int. Cl.
| | | |
|---|---|---|
| *G03F 7/033* | (2006.01) | |
| *G03F 7/037* | (2006.01) | |
| *G03F 7/11* | (2006.01) | |
| *G03F 7/031* | (2006.01) | |
| *G03F 7/039* | (2006.01) | |

(Continued)

(52) U.S. Cl.
CPC ................ *G03F 7/11* (2013.01); *G03F 7/031* (2013.01); *G03F 7/033* (2013.01); *G03F 7/037* (2013.01); *G03F 7/038* (2013.01); *G03F 7/039* (2013.01); *G03F 7/16* (2013.01); *G03F 7/168* (2013.01); *G03F 7/2002* (2013.01); *G03F 7/322* (2013.01); *H05K 1/028* (2013.01); *H05K 1/0373* (2013.01); *H05K 3/281* (2013.01); *H05K 3/287* (2013.01); *H05K 2201/0145* (2013.01); *H05K 2201/0158* (2013.01); *H05K 2203/0191* (2013.01); *H05K 2203/066* (2013.01)

(58) Field of Classification Search
CPC . G03F 7/11; G03F 7/033; G03F 7/037; G03F 7/30
USPC .................................................... 430/272.1
See application file for complete search history.

(56) References Cited

U.S. PATENT DOCUMENTS

| | | | |
|---|---|---|---|
| 5,217,845 A | 6/1993 | Steppan et al. | |
| 6,607,866 B1 * | 8/2003 | Kawamura | B41N 3/036 101/453 |

(Continued)

FOREIGN PATENT DOCUMENTS

| | | |
|---|---|---|
| CN | 105278251 | 1/2016 |
| KR | 10-2006-0088123 | 8/2006 |
| KR | 10-2015-0033324 | 4/2015 |

OTHER PUBLICATIONS

Office Action from corresponding Taiwanese Appln. No. 106103238, dated Mar. 15, 2018.

(Continued)

*Primary Examiner* — John S Chu
(74) *Attorney, Agent, or Firm* — Grossman, Tucker, Perreault & Pfleger, PLLC

(57) ABSTRACT

A photosensitive dry film and uses of the same are provided. The photosensitive dry film comprises a support layer and a photosensitive resin layer disposed on the support layer, wherein the support layer has a first surface and a second surface opposite the first surface, and the first surface is in contact with the photosensitive resin layer and has a non-smooth structure.

8 Claims, 1 Drawing Sheet

(51) Int. Cl.
    *G03F 7/038*     (2006.01)
    *G03F 7/16*     (2006.01)
    *G03F 7/32*     (2006.01)
    *H05K 1/02*     (2006.01)
    *H05K 1/03*     (2006.01)
    *G03F 7/20*     (2006.01)
    *H05K 3/28*     (2006.01)

(56) References Cited

U.S. PATENT DOCUMENTS

2011/0065046 A1     3/2011     Tanaka et al.
2015/0366070 A1     12/2015     Jeong et al.
2015/0382473 A1     12/2015     Okamoto et al.

OTHER PUBLICATIONS

Office Action from related Korean Appln. No. 20-2018-0000402, dated Aug. 6, 2019. English translation attached.

* cited by examiner

PHOTOSENSITIVE DRY FILM AND USES OF THE SAME

CLAIM FOR PRIORITY

This application claims the benefit of Taiwan Patent Application No. 106103238 filed on Jan. 26, 2017, the subject matters of which are incorporated herein in their entirety by reference.

BACKGROUND OF THE INVENTION

Field of the Invention

The present invention relates to a photosensitive dry film and uses of the same, especially a photosensitive dry film including a support layer with a non-smooth structure and a photosensitive resin layer, and uses of such photosensitive dry film in preparing a matte covering film.

Descriptions of the Related Art

Flexible printed circuit boards are widely used in various products, including 3C products, optical lens modules, solar cells, etc. In the conventional flexible printed circuit board manufacturing process, a coverlay adhesive and liquid solder mask are generally used to provide a circuit protective film (i.e., a coverlay) on a flexible printed circuit board to protect the copper circuit of the flexible printed circuit board and improve the flexing resistance of the same. However, due to the poor resolution performance of the coverlay adhesive and the bad flexibility of the liquid solder mask, the coverlay adhesive and liquid solder mask must be used together, and which will complicate the flexible printed circuit board manufacturing process. In view of this, a photoimageable coverlay (PIC) that could form fine openings and patterns and have both good resolution performance and flexibility becomes the most popular solution for the circuit protection of flexible printed circuit boards.

Modified acrylates or polyimides (PIs) are typical materials of photoimageable coverlay. They could meet the flexible printed circuit board's requirements in terms of mechanical strength, flexibility, solvent resistance, dielectric properties and heat resistance. However, the coverlay formed of the cured product of modified acrylate is transparent, and the coverlay formed of the cured product of polyimide is transparent and light yellow. When such coverlays are applied on the surface of flexible printed circuit boards, the circuit pattern of the flexible printed circuit board is still visible. Furthermore, such coverlays are too glossy, they needs to be improved in terms of matte and high quality texture.

SUMMARY OF THE INVENTION

In view of the aforementioned technical problems, the present invention provides a photosensitive dry film which is useful in manufacturing a covering film with good resolution performance and low glossiness. The covering film provides protective film function and privacy film function to circuits of flexible printed circuit boards and has high quality texture.

Therefore, an objective of the present invention is to provide a photosensitive dry film, which comprises a support layer and a photosensitive resin layer disposed on the support layer, wherein the support layer has a first surface and a second surface opposite the first surface, and the first surface is in contact with the photosensitive resin layer and has a non-smooth structure.

In some embodiments of the present invention, the first surface has a value of glossiness of less than 15 GU determined according to ASTM D523 standard.

In some embodiments of the present invention, the average surface roughness (Ra) of the first surface is 110 nm to 850 nm higher than that of the second surface.

In some embodiments of the present invention, the second surface has a smooth structure.

In some embodiments of the present invention, the first surface has an average surface roughness (Ra) ranging from 260 nm to 1000 nm. A 3D roughness parameter, an interferometer or an atomic force microscope can be used to measure the mean line average surface roughness of the surface to be tested.

In some embodiments of the present invention, the support layer has a thickness ranging from 10 μm to 250 μm.

In some embodiments of the present invention, the support layer is a polyester film or polyolefin film.

In some embodiments of the present invention, the photosensitive resin layer is formed by coating a photosensitive resin composition on the first surface of the support layer and drying the coated photosensitive resin composition, and wherein the photosensitive resin composition comprises 15 wt % to 80 wt % of a polymeric binder, 2 wt % to 65 wt % of a photopolymerizable compound with an unsaturated group, 0.5 wt % to 20 wt % of a photoinitiator and a solvent as the remainder. The polymeric binder can be an acrylic binder or a polyimide binder, and the unsaturated group of the photopolymerizable compound can be an acrylate group.

In some embodiments of the present invention, the photosensitive resin composition further comprises an additive.

Another objective of the present invention is to provide a method for forming a covering film, which comprises the following steps:

a lamination step to laminate the aforementioned photosensitive dry film on a substrate to provide a laminated structure sequentially including the substrate, the photosensitive resin layer, and the support layer;

an exposure step to expose at least a portion of the photosensitive resin layer after the lamination step, wherein the support layer is removed before or after the exposure step; and a development step to develop the photosensitive resin layer after the exposure step, wherein, after the development step, the unexposed portion of the photosensitive resin layer is removed, and the exposed portion of the photosensitive resin layer forms the covering film.

The above-mentioned covering film is matte and can serve as a privacy film.

To render the above objectives, technical features and advantages of the present invention more apparent, the present invention will be described in detail with reference to some embodiments hereinafter.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification (especially in the appended claims) should include both the singular and the plural forms.

The photosensitive dry film of the present invention comprises a support layer and a photosensitive resin layer disposed on the support layer. The photosensitive dry film of the present invention features in that the surface of the support layer that is in contact with the photosensitive resin layer has a non-smooth structure. The protective covering film structure formed from the photosensitive dry film of the present invention has better resolution performance and lower glossiness compared with that formed from a dry film using a support layer with a smooth structure. Furthermore, the protective covering film structure formed from the photosensitive dry film of the present invention provides not only protective film function but also privacy film function to circuits of flexible printed circuit boards and has a matte and high quality texture.

Figure 1:
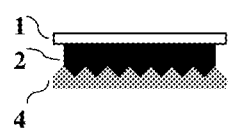
FIG. 1 is a schematic diagram showing a photosensitive dry film according to an embodiment of the present invention.

FIG. 1 is a schematic diagram showing a photosensitive dry film according to an embodiment of the present invention. In this embodiment, the photosensitive dry film comprises a support layer 4 and a photosensitive resin layer 2 disposed on the support layer 4. The support layer 4 has a first surface and a second surface opposite the first surface, and the first surface is in contact with the photosensitive resin layer 2 and has a non-smooth structure. Furthermore, in this embodiment, the photosensitive dry film comprises a release layer 1 disposed on the surface of the photosensitive resin layer 2 that is not in contact with the support layer 4. The release layer 1 protects and isolates the photosensitive resin layer 2 during storage. The material of the release layer 1 is not particularly limited and can be any conventional material known in the art, as long as the release layer 1 could protect the photosensitive resin layer 2 and does not leave residue on the surface of the photosensitive resin layer 2 after being released from the photosensitive resin layer 2. Use of a release layer is not one of the features of the present invention and can be accomplished by persons with ordinary skill in the art based on their ordinary skill after reading the disclosure of the subject application and therefore, will not be described in detail.

In the photosensitive dry film of the present invention, the surface of the support layer that is in contact with the photosensitive resin layer, i.e., the first surface, has a non-smooth structure.

In order to obtain a matte texture, the first surface has a low glossiness value. In some embodiments of the present invention, the first surface has a value of glossiness of less than 15 GU, e.g., 14 GU, 13 GU, 12 GU or lower, and preferably less than 10 GU, as determined according to ASTM D523 standard.

In order to obtain a matte texture and good photosensitivity, the surface roughness of the first surface of the support layer must be higher than that of the second surface of the support layer. In other words, the second surface is smoother than the first surface. Preferably, the average surface roughness (Ra) of the first surface is 110 nm to 850 nm higher than that of the second surface.

In some embodiments of the photosensitive dry film of the present invention, the second surface of the support layer has a smooth structure. In some embodiments of the photosensitive dry film of the present invention, the second surface of the support layer has an average surface roughness (Ra) ranging from 0 nm to 200 nm.

In some embodiments of the photosensitive dry film of the present invention, the first surface of the support layer has an average surface roughness (Ra) ranging from 260 nm to 1000 nm and preferably ranging from 280 nm to 800 nm, such as 300 nm, 350 nm, 400 nm, 450 nm, 500 nm, 550 nm, 600 nm, 650 nm, 700 nm, 750 nm or higher. If the surface roughness of the first surface is too low, e.g., lower than 260 nm, the matte texture of the covering film obtained after conducting an exposure step and a development step to the photosensitive dry film of the present invention will be adversely affected. If the surface roughness of the first surface is too high, e.g., higher than 1000 nm, the pattern resolution of the covering film obtained after conducting an exposure step and a development step to the photosensitive dry film of the present invention will be adversely affected.

In order to obtain a covering film with a high resolution pattern after conducting an exposure step and a development step to the photosensitive resin layer of the photosensitive dry film, it is preferred that only one surface of the support layer, preferably the first surface, has a non-smooth structure, and it is particularly preferred that the average surface roughness of the first surface is 130 nm to 650 nm, e.g., 150 nm, 200 nm, 300 nm, 400 nm, 500 nm or more, higher than that of the second surface.

The material of the support layer of the photosensitive dry film is not particularly limited and can be any material known in the art. A transparent support layer is preferred. For example, the support layer can be a polyester film or polyolefin film. The polyester film includes, for example, a polyethylene terephthalate (PET) film; and the polyolefin film includes, for example, a polypropylene film. Furthermore, the thickness of the support layer is not particularly limited, as long as the support layer is thick enough to provide the desired support. In general, the thickness of the support layer can be 10 μm to 250 μm, and preferably 12 μm to 50 μm, such as 12 μm, 15 μm, 16 μm, 20 μm, 25 μm, 30 μm, 35 μm, 40 μm or 45 μm, but the present invention is not limited thereto.

The photosensitive resin layer of the photosensitive dry film of the present invention is formed by coating a photosensitive resin composition on the first surface of the support layer and drying the coated photosensitive resin composition. The photosensitive resin composition is applicable in the printed circuit board process, including alkaline etching process, gold plating process, electroless nickel immersion gold (ENIG) process, etc. The photosensitive resin composition comprises 15 wt % to 80 wt % of a polymeric binder, 2 wt % to 65 wt % of a photopolymerizable compound with an unsaturated group, and 0.5 wt % to 20 wt % of a photoinitiator, based on the total weight of the photosensitive resin composition. The coating of the photosensitive resin composition can be carried out by known methods using, for example, a roll coater, a comma coater, a gravure coater, an air knife coater, a die coater, a bar coater, and the like. Furthermore, the drying of the coated photosensitive resin composition can be carried out at 70° C. to 150° C. for 5 to 30 minutes. The photosensitive resin composition can be any known photosensitive coverlay adhesive that is useful in protecting circuits of printed circuit boards. In general, the main ingredients of the photosensitive resin composition includes a polymeric binder, a photopolymerizable compound, a photoinitiator, solvent, etc.

Examples of the polymeric binder include but are limited to acrylic resins, styrene resins, epoxy resins, amide resins, amide-epoxy resins, polyimide precursor, alkyd resins, phenol resins, polyurethane resins, epoxy acrylate resins obtained by a reaction between epoxy resins and (meth)acrylic acids, acid-modified epoxy acrylate resins obtained by a reaction between epoxy acrylate resins and acid anhydrides, and a mixture of two or more thereof.

The photopolymerizable compound with an unsaturated group is generally a monomer or a short-chain oligomer and has an ethylenic unsaturated group. The ethylenic unsaturated group may be a monofunctional group, a difunctional group or a polyfunctional group. An example of the ethylenic unsaturated group is acrylate group. Examples of the photopolymerizable compound with an unsaturated group include but are not limited to 1,4-butanediol di(meth)acrylate, 1,6-hexanediol di(meth)acrylate, neopentylglycol di(meth)acrylate, polyethyleneglycol di(meth)acrylate, neopentylglycol dipate di(meth)acrylate, neopentylglycol di(meth)acrylate hydroxypivalate, dicyclopentdienyl di(meth)acrylate, caprolactone modified dicyclopentdienyl di(meth)acrylate, allylated cyclohexyl di(meth)acrylate, isocyanurate di(meth)acrylate, trimethylol propane tri(meth)acrylate, dipentaerythriol tri(meth)acrylate, pentaerythriol tri(meth)acrylate, tris(acryloxyethyl) isocyanurate, dipentaerythriol penta(meth)acrylate, dipentaerythriol hexa(meth)acrylate, trimethylolpropane ethoxylate triacrylate, propoxylated glycerol triacrylate, bisphenol A ethoxylate dimethacrylate, aliphatic urethane oligomer, and a mixture of two or more thereof.

In some embodiments of the present invention, the polymeric binder is an acrylic based binder (e.g., an acrylic resin) or a polyimide based binder (e.g., a polyimide precursor), and the photopolymerizable compound with an unsaturated group is a compound with an acrylate group.

The photoinitiator is able to provide a free radical upon being light irradiated, and a polymerization reaction can be initiated through the transfer of the free radical. The species of the photoinitiators are well known to persons having ordinary skill in the art. Examples of the photoinitiator include but are not limited to benzoin, benzoin alkyl ether, benzil, ketals, acetophenones, benzophenone, 9-phenylacridine, 4,4'-dimethylamino benzophenone, thioxanthones, morpholino-propanone compounds, α-hydroxyketone, N-phenylglycine, imidazole dimers, and a mixture of two or more thereof. In addition, a homologue of 9-phenylacridine such as that disclosed in U.S. Pat. No. 5,217,845 (the subject matters of which are incorporated herein in their entirety by reference) is also suitable for the present invention.

The photosensitive resin composition may optionally further comprise a solvent. The solvent here can be any inert solvent that does not react with other components of the photosensitive resin composition. Examples of the solvent include but are not limited to methanol, ethanol, propanol, butanol, acetone, butanone, N-methyl-2-pyrrolidone, methyl ethyl ketone, methylcellosolve, ethylcellosolve, butylcellosolve, toluene, N,N-dimethylformamide, propylene glycol monomethyl ether, dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol methyl ether, tetraethylene glycol dimethyl ether, γ-butyrolactone, hexamethylphosphoramide, propylene glycol methyl ether acetate, a mixture of two or more thereof.

In some embodiments of the present invention, the photosensitive resin composition may comprise 15 wt % to 50 wt % of a polymeric binder, 2 wt % to 30 wt % of a photopolymerizable compound with an unsaturated group, 0.5 wt % to 5 wt % of a photoinitiator and a solvent as the remainder, based on the total weight of the photosensitive resin composition. Furthermore, the photosensitive resin composition may optionally further comprise an additive that is useful in manufacturing a photosensitive dry film and well-known to persons with ordinary skill in the art. Examples of such additive include but are not limited to filler (e.g., carbon black, silicon dioxide, and aluminum oxide), thermal curing agent, dye, leveling agent, antifoaming agent, and flame retardant. The amount of the additive can be adjusted by persons with ordinary skill in the art through routine experiments. In some embodiments of the present invention, the photosensitive resin composition further comprises carbon black to provide a better matte black appearance to the covering film prepared therefrom. Since the covering film is visually matte black, it does not pick up fingerprint and is provided with a good texture and better privacy film function. The specific preparation of the photosensitive resin composition will be illustrated in the following examples.

The photosensitive dry film of the present invention can be used to provide a covering film on surfaces of printed circuit boards as a coverlay. Therefore, the present invention also provides a method for forming a covering film. The method comprises the following steps: a lamination step to laminate the photosensitive dry film on a substrate to provide a laminated structure sequentially including the substrate, the photosensitive resin layer, and the support layer; an exposure step to expose at least a portion of the photosensitive resin layer after the lamination step, wherein the support layer is removed before or after the exposure step; and a development step to develop the photosensitive resin layer after the exposure step, wherein, after the development step, the unexposed portion of the photosensitive resin layer is removed, and the exposed portion of the photosensitive resin layer forms the covering film.

The covering film has a value of glossiness of less than 15 GU determined according to ASTM D523 standard.

Figure 2:
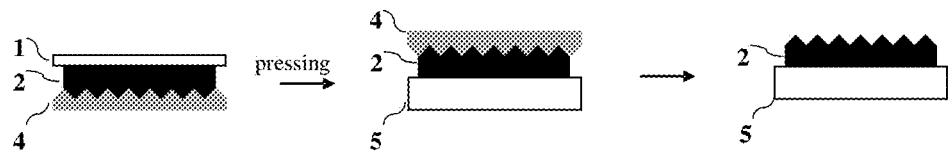
FIG. 2 is a schematic diagram showing the process of using the photosensitive dry film of the present invention to prepare a covering film.

Hereinafter, the method of the present invention will be described in detail with reference to the photosensitive dry film shown in FIG. 1. FIG. 2 is a schematic diagram showing the process of using the photosensitive dry film of the present invention to provide a covering film. As shown in FIG. 2, the method for forming a covering film according to the present invention comprises removing the release layer 1 and then laminating the photosensitive dry film on the substrate 5 in such a way that the photosensitive resin layer 2 is attached to the substrate 5 with the surface that is not in contact with the support layer 4 to provide a laminated structure sequentially including the substrate 5, the photosensitive resin layer 2, and the support layer 4. Thereafter, an exposure step is performed to expose at least a portion of the photosensitive resin layer according to the desired covering layer pattern. If the support layer 4 is transparent, the support layer 4 can be removed before or after the exposure step, and it is preferred to remove the support layer 4 after the exposure step in terms of providing a covering film with a low glossiness feeling. After the exposure step is done and the support layer 4 is removed, a development step is performed to remove the unexposed portion of the photosensitive resin layer 2 and the exposed portion of the photosensitive resin layer 2 forms the covering film thereafter.

The covering film obtained from the photosensitive dry film of the present invention has good resolution (90 μm or lower) and a matte and hazy profile. Therefore, the covering film is beautiful and can serve as a privacy film for circuits.

The present invention is further illustrated by the embodiments hereinafter, wherein the measuring instruments and methods are respectively as follows:

[Glossiness Test]

The glossiness test was carried out by using a glossmeter (Model No.: VG2000; Nippon Denshoku Company) to measure the Gloss 60° value of the test sameple according to ASTM D523 standard.

[Surface Roughness Test]

The surface roughness (Ra) of the test sample was measured by using a handheld surface roughness tester (Model No.: Surtronic S-100 Series; Tested area: 100 μm×100 μm).

[Resolution Test]

The resolution test was carried out by the following steps. The test sample was exposed (exposure energy: Step 6) and spray developed. Thereafter, the pattern of the cured photosensitive resin layer of the test sample was observed with an optical microscope to evaluate the resolution of the test sample. The resolution was evaluated based on the smallest diameter (unit: μm) of the openings where the unexposed portion of the photosensitive resin layer is completely removed without leaving any residue.

[Matte Profile Test]

The matte profile test was carried out by observing the profile of the covering film obtained from the cured photosensitive resin layer. If the profile of the covering film is matte and the design of the circuit covered by the covering film is invisible, the matte profile test is recorded as "○". If the profile of the covering film is glossy and the design of the circuit covered by the covering film is still visible, the matte profile test is recorded as "X".

EXAMPLES

<Preparation of Photosensitive Resin Composition 1>

A polymeric binder, a photopolymerizable compound with an unsaturated group, a photoinitiator, a thermal curing agent, a solvent and an inorganic filler were uniformly mixed under stirring in accordance with the constitutions shown in the following Table 1 to obtain the photosensitive resin composition 1.

<Preparation of Photosensitive Resin Composition 2>

(I) Preparation of Polymeric Binder

Firstly, a polyamic acid oligomer was prepared according to the following method. 21.81 g (0.1 mol) of pyromellitic dianhydride (PMDA) was dissolved into 126 g of N-methyl-2-pyrrolidinone (NMP) to obtain a reaction mixture. The reaction mixture was heated to 50° C. to react under stirring for two hours. Thereafter, 2.322 g (0.02 mol) of 2-hydroxyethyl acrylate (HEA) was slowly added dropwise to the reaction mixture while the reaction mixture was maintained at 50° C. to react under stirring for two hours. Then, 18.018 g (0.09 mol) of 4,4'-diamino-diphenyl ether (ODA) was added and completely dissolved into the reaction mixture, and the reaction mixture was maintained at 50° C. to react under stirring for six hours to obtain the polyamic acid oligomer.

A diamine monomer was prepared according to the following method afterward. 10.814 g (0.1 mol) of p-phenylenediamine (pPDA) was added into toluene and 42.006 g (0.2 mol) of trifluoroacetic acid anhydride (TFAA) was slowly added into the obtained solution under stirring thereafter. The resultant solution was maintained at 50° C. to react under stirring for one hour to obtain the diamine monomer.

The polymeric binder was prepared by uniformly mixing 200 g of the polyamic acid oligomer (solid content: 25%) and 3 g of the diamine monomer.

(II) Preparation of Photosensitive Resin Composition 2

A polymeric binder, a photopolymerizable compound with an unsaturated group, a photoinitiator, a solvent, an inorganic filler and an additive were uniformly mixed under stirring in accordance with the constitutions shown in the following Table 2 to obtain the photosensitive resin composition 2.

TABLE 1

| Ingredients | Contents | Amounts (parts by weight) |
| --- | --- | --- |
| Polymeric binder | Acrylic resin (solid content: 40%) with the following formulation: 10 g of methacrylic acid, 10 g of methyl methacrylate, 15 g of 2-hydroxyethyl methacrylate, 1 g of styrene, 15 g of butyl acrylate, 0.5 g of 2,2'-azobis(2-methylpropionitrile), 15 g of isopropanol, and 50 g of butanone | 40 |
| Photopolymerizable compound with an unsaturated group | Propoxylated glycerol triacrylate (CAS No. 52408-84-1) and bisphenol A ethoxylate dimethacrylate (CAS No. 41637-38-1) | 25 |
| Photoinitiator | α-hydroxyketone (Irgacure ® 907) | 1 |
| Thermal curing agent | Melamine resin | 12 |
| Solvent | Butanone | 20 |
| Inorganic filler | Silicon dioxide | 1 |
| | Aluminum oxide | 1 |

TABLE 2

| Ingredients | Contents | Amounts (parts by weight) |
| --- | --- | --- |
| Polymeric binder | A composition with the following formulation: 200 g of the polyamic acid oligomer (solid content: 25%) and 3 g of the diamine monomer | 18.3 |
| Photopolymerizable compound with an unsaturated group | A composition with the following formulation: 10 parts by weight of trimethylolpropane ethoxylate triacrylate (Photomer 4155 Cognis 7) and 5 parts by weight of trimethylolpropane triacrylate oligomer (EM2382, available from Eternal Materials) | 2 |
| Photoinitiator | A composition with the following formulation: 0.1 parts by weight of N-phenylglycine (NPG, available from Hampford) and 1.9 parts by weight of imidazole dimer (BCIM, available from Black Gold) | 1.2 |
| Solvent | N-methyl-2-pyrrolidone | 74 |
| Inorganic filler | Carbon black | 3.1 |
| Additive | Leveling agent | 1 |

<Preparation of Photosensitive Resin Composition 3>

A polymeric binder, a photopolymerizable compound with an unsaturated group, a photoinitiator, a thermal curing agent, a solvent, an inorganic filler, and an additive were uniformly mixed under stirring in accordance with the constitutions shown in the following Table 3 to obtain the photosensitive resin composition 3.

TABLE 3

| Ingredients | Contents | Amounts (parts by weight) |
| --- | --- | --- |
| Polymeric binder | Acrylic resin (solid content: 40%) with the following formulation: 10 g of methacrylic acid, 10 g of methyl methacrylate, 15 g of 2-hydroxyethyl methacrylate, 1 g of styrene, 15 g of butyl acrylate, 0.5 g of 2,2'-azobis(2-methylpropionitrile), 15 g of isopropanol, and 50 g of butanone | 50 |
| Photopolymerizable compound with an unsaturated group | Propoxylated glycerol triacrylate (CAS No. 52408-84-1) and bisphenol A ethoxylate dimethacrylate (CAS No. 41637-38-1) | 12.5 |
| Photoinitiator | α-hydroxyketone (Irgacure ® 907) | 1.67 |
| Thermal curing agent | Melamine resin | 15 |
| Solvent | Butanone | 16.67 |
| Inorganic filler | Carbon black | 1.67 |
| Additive | Leveling agent | 2.50 |

<Preparation of Photosensitive Dry Film>

Example 1

The photosensitive resin composition 1 was uniformly coated on the first surface of the PET support layer having the glossiness, surface roughness and thickness characteristics shown in the following Table 4. The coated photosensitive resin composition was dried by using a heated-air contraflow dryer at 90° C. for about 5 minutes to obtain a 40 μm thick photosensitive resin layer. Thereafter, a silicone surface modified PET film serving as a protective film was attached to the surface of the photosensitive resin layer that is not in contact with the support layer to obtain the photosensitive dry film 1 shown in FIG. 1.

Example 2

The preparation procedures of Example 1 were repeated to prepare a photosensitive dry film 2, except that a PET support layer with different glossiness and surface roughness was used, as shown in Table 4.

Example 3

The preparation procedures of Example 1 were repeated to prepare a photosensitive dry film 3, except that the photosensitive resin composition 2 was used to form the photosensitive resin layer and a PET support layer with different glossiness, surface roughness and thickness was used, as shown in Table 4.

Example 4

The preparation procedures of Example 3 were repeated to prepare a photosensitive dry film 4, except that a PET support layer with different glossiness, surface roughness and thickness was used, as shown in Table 4.

Example 5

The preparation procedures of Example 1 were repeated to prepare a photosensitive dry film 5, except that the photosensitive resin composition 3 was used to form the photosensitive resin layer and a PET support layer with different glossiness, surface roughness and thickness was used, as shown in Table 4.

Example 6

The preparation procedures of Example 5 were repeated to prepare a photosensitive dry film 6, except that a PET support layer with different glossiness, surface roughness and thickness was used, as shown in Table 4.

Example 7

The preparation procedures of Example 5 were repeated to prepare a photosensitive dry film 7, except that a PET support layer with different glossiness and surface roughness was used, as shown in Table 4.

Example 8

The preparation procedures of Example 5 were repeated to prepare a photosensitive dry film 8, except that a PET support layer with different glossiness, surface roughness and thickness was used, as shown in Table 4.

Example 9

The preparation procedures of Example 5 were repeated to prepare a photosensitive dry film 9, except that a PET support layer with different glossiness, surface roughness and thickness was used, as shown in Table 4.

Comparative Examples 1 and 2

The preparation procedures of Example 1 were repeated to prepare a comparative photosensitive dry film 1 and comparative photosensitive dry film 2, except that a PET support layer with different glossiness and surface roughness was used, respectively, as shown in Table 4.

Comparative Examples 3 and 4

The preparation procedures of Example 3 were repeated to prepare a comparative photosensitive dry film 3 and comparative photosensitive dry film 4, except that a PET support layer with different glossiness, surface roughness and thickness was used, respectively, as shown in Table 4.

Comparative Example 5

The preparation procedures of Example 5 were repeated to prepare a comparative photosensitive dry film 5, except that a PET support layer with different glossiness, surface roughness and thickness was used, as shown in Table 4.

TABLE 4

| | Photosensitive resin composition | Glossiness of first surface of support layer (GU) | Surface roughness Ra of first surface of support layer ($\mu$m) | Surface roughness Ra of second surface of support layer ($\mu$m) | Thickness of support layer |
|---|---|---|---|---|---|
| Example 1 | 1 | 11.2 | 0.32 | 0.17 | 30 |
| Example 2 | 1 | 12.3 | 0.3 | 0.17 | 30 |
| Example 3 | 2 | 9.9 | 0.28 | 0.1 | 25 |
| Example 4 | 2 | 9.8 | 0.36 | 0.1 | 16 |
| Example 5 | 3 | 9.4 | 0.6 | 0.17 | 23 |
| Example 6 | 3 | 7.7 | 0.7 | 0.17 | 30 |
| Example 7 | 3 | 6.8 | 0.75 | 0.15 | 23 |
| Example 8 | 3 | 8.0 | 0.77 | 0.15 | 38 |
| Example 9 | 3 | 6.1 | 0.72 | 0.16 | 46 |
| Comparative Example 1 | 1 | 77.2 | 0.25 | 0.25 | 30 |
| Comparative Example 2 | 1 | 169.8 | 0.19 | 0.07 | 30 |
| Comparative Example 3 | 2 | 136.1 | 0.1 | 0.01 | 16 |
| Comparative Example 4 | 2 | 9.8 | 0.8 | 0.7 | 25 |
| Comparative Example 5 | 3 | 5.5 | 1.1 | 0.21 | 30 |

<Preparation of Covering Film (I)>

A copper clad laminate for preparing a printed circuit board (MCL-E-679, available from Hitachi Chemical Company) was used. The copper surface of the copper clad laminate was treated with a roughening pre-treatment solution CZ-8100 (available from MEC Company) and washed with water and dried afterward. The copper clad laminate was prepared by laminating a 12 $\mu$m thick copper foil on a glass epoxy substrate.

Photosensitive dry film 1, photosensitive dry film 2, photosensitive dry film 5 to photosensitive dry film 9, comparative photosensitive dry film 1, comparative photosensitive dry film 2 and comparative photosensitive dry film 5 were respectively used to provide a covering film on the copper surface of the aforementioned pretreated copper clad laminate. In detail, the protective film of the photosensitive dry film or comparative photosensitive dry film was removed, and then the photosensitive resin layer along with the support layer was attached to the copper surface. The obtained layer structure was pressed using a compressing-type vacuum press (Model No.: MVP-600; Eternal Material Company) to provide a laminated structure including the copper clad laminate, photosensitive resin layer and support layer (temperature of pressing hot plate: 50° C. to 60° C.; Evacuation time: 30 seconds; vacuum pressure: less than 2 hPa; pressing time: 30 seconds; and pressing pressure: 0.5 MPa to 0.7 MPa).

The laminated structure was left to stand under room temperature for 0.5 hours and exposed and developed afterward to form a covering film on the copper surface of the copper clad laminate. In detail, the exposure step was performed by using a 21 step tablet and a direct imaging exposure machine which uses an ultra-pressure mercury lamp as light source (Model No.: DXP-3512; ORC Manufacturing Company). After the exposure step, the laminated structure was left to stand under room temperature for 30 minutes, and the support layer of the laminated structure was removed afterward. The laminated structure was then spray-developed for 30 to 50 seconds by using a 1% sodium carbonate aqueous solution (30° C.) to remove the unexposed portion of the photosensitive resin layer. An exposure energy with which the glossy remaining steps on a 21 step tablet is 9 to 10 is used as the sensitivity (mJ/cm$^2$) of the photosensitive resin layer. Finally, the laminated structure was dried in an oven (150° C. to 155° C.) for 50 to 60 minutes. The pattern of the covering film was evaluated, and the results of the evaluations were tabulated in the following Table 5.

<Preparation of Covering Film (II)>

A copper clad laminate for preparing a printed circuit board (MCL-E-679, available from Hitachi Chemical Company) was used. The copper surface of the copper clad laminate was treated with a 5% to 10% H$_2$SO$_4$ aqueous solution and washed with water and dried afterward. The copper clad laminate was prepared by laminating a 12 μm thick copper foil on a polyimide substrate.

Photosensitive dry film 3, photosensitive dry film 4, comparative photosensitive dry film 3 and comparative photosensitive dry film 4 were respectively used to provide a covering film on the copper surface of the aforementioned pretreated copper clad laminate. In detail, the protective film of the photosensitive dry film or comparative photosensitive dry film was removed, and then the photosensitive resin layer along with the support layer was attached to the copper surface. The obtained layer structure was pressed using a hot roller press to provide a laminated structure including the copper clad laminate, photosensitive resin layer and support layer (temperature of pressing: 60° C. to 70° C.; pressing velocity: 0.5 M/min to 1.0 M/min; pressing pressure: 5 kgf/cm$^2$ to 6 kgf/cm$^2$).

The laminated structure was left to stand under room temperature for at least 30 minutes and exposed and developed afterward to form a covering film on the copper surface of the copper clad laminate. In detail, the exposure step was performed by using a 21 step tablet and a direct imaging exposure machine which uses an ultra-pressure mercury lamp as light source. After the exposure step, the support layer of the exposed laminated structure was removed, and the exposed laminated structure was dried at 90° C. for 15 minutes. The laminated structure was then spray-developed for 44 seconds by using a 1% potassium carbonate aqueous solution (30° C.) to remove the unexposed portion of the photosensitive resin layer. An exposure energy with which the glossy remaining steps on a 21 step tablet is 6 to 8 is used as the sensitivity (mJ/cm$^2$) of the photosensitive resin layer. Finally, the laminated structure was dried in an oven (170° C. to 275° C.) for 60 to 120 minutes. The pattern of the obtained covering film was evaluated, and the results of the evaluations were tabulated in the following Table 5.

TABLE 5

|  | Resolution (μm) | Matte texture |
|---|---|---|
| Example 1 | 90 | ◯ |
| Example 2 | 80 | ◯ |

TABLE 5-continued

|  | Resolution (μm) | Matte texture |
|---|---|---|
| Example 3 | 70 | ◯ |
| Example 4 | 70 | ◯ |
| Example 5 | 70 | ◯ |
| Example 6 | 70 | ◯ |
| Example 7 | 60 | ◯ |
| Example 8 | 70 | ◯ |
| Example 9 | 80 | ◯ |
| Comparative example 1 | >100 | X |
| Comparative example 2 | 70 | X |
| Comparative example 3 | 70 | X |
| Comparative example 4 | >100 | ◯ |
| Comparative example 5 | >100 | ◯ |

As shown in Table 5, the covering films obtained from the photosensitive dry films of the present invention each has an outstanding resolution (90 μm or lower) and a matte texture surface, making them beautiful and have privacy film function.

As can be seen from the comparison between Comparative example 1 and Examples 1 and 2, when the surface roughness of the first surface of the support layer and the surface roughness difference between the first surface and the second surface of the support layer are both too low, for example, when the surface roughness of the first surface is lower than 260 nm and the surface roughness difference between the first surface and the second surface is lower than 110 nm, the obtained covering film does not have a matte texture and the resolution of the pattern formed from the photosensitive resin layer is poor. As can be seen from the comparison between Comparative examples 2 and 3 and Examples 1 to 4, when the surface roughness of the first surface of the support layer is too low (e.g., lower than 260 nm), the obtained covering films does not have a matte texture.

As can be seen from the comparison between Comparative example 4 and Examples 3 and 4, when the surface roughness difference between the first surface and the second surface of the support layer is too low (e.g., lower than 110 nm), the resolution of the pattern formed from the photosensitive resin layer is poor.

As can be seen from the comparison between Comparative example 5 and Examples 5 to 9, when the surface roughness of the first surface of the support layer and the surface roughness difference between the first surface and the second surface of the support layer are both too high, for example, when the surface roughness of the first surface is higher than 1000 nm and the surface roughness difference between the first surface and the second surface is higher than 850 nm, the resolution of the pattern formed from the photosensitive resin layer is poor.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF REFERENCE NUMERALS

1: release layer
2: photosensitive resin layer
4: support layer
5: substrate

What is claimed is:

1. A photosensitive dry film, comprising a support layer and a photosensitive resin layer directly disposed on the support layer, wherein the support layer has a first surface and a second surface opposite the first surface, and the first surface is in contact with the photosensitive resin layer and has a non-smooth structure, wherein the average surface roughness (Ra) of the first surface is 110 nm to 500 higher than that of the second surface, and the first surface of the support layer has an average surface roughness ranging from 550 nm to 1000 nm.

2. The photosensitive dry film of claim 1, wherein the first surface has a value of glossiness of less than 15 GU determined according to ASTM D523 standard.

3. The photosensitive dry film of claim 1, wherein the support layer has a thickness ranging from 10 μm to 250 μm.

4. The photosensitive dry film of claim 1, wherein the support layer is a polyester film or polyolefin film.

5. The photosensitive dry film of claim 1, wherein the photosensitive resin layer is formed by coating a photosensitive resin composition on the first surface of the support layer and drying the coated photosensitive resin composition, and wherein the photosensitive resin composition comprises 15 wt % to 80 wt % of a polymeric binder, 2 wt % to 65 wt % of a photopolymerizable compound with an unsaturated group, and 0.5 wt % to 20 wt % of a photoinitiator.

6. The photosensitive dry film of claim 5, wherein the polymeric binder is an acrylic binder or a polyimide binder, and the photopolymerizable compound with an unsaturated group is a compound with an acrylate group.

7. The photosensitive dry film of claim 5, wherein the photosensitive resin composition further comprises an additive.

8. A method for forming a covering film, comprising:
a lamination step to laminate the photosensitive dry film of claim 1 on a substrate to provide a laminated structure sequentially including the substrate, the photosensitive resin layer, and the support layer;
an exposure step to expose at least a portion of the photosensitive resin layer after the lamination step, wherein the support layer is removed before or after the exposure step; and
a development step to develop the photosensitive resin layer after the exposure step,
wherein, after the development step, the unexposed portion of the photosensitive resin layer is removed, and the exposed portion of the photosensitive resin layer forms the covering film.

* * * * *